(12) United States Patent
Mostafa et al.

(10) Patent No.: US 12,332,606 B2
(45) Date of Patent: Jun. 17, 2025

(54) ANALOG-TO-TIME CONVERTER

(71) Applicant: Commissariat à l'Energie Atomique et aux Energies Alternatives, Paris (FR)

(72) Inventors: Ali Mostafa, Grenoble (FR); Franck Badets, Grenoble (FR); Emmanuel Hardy, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 170 days.

(21) Appl. No.: 18/473,220

(22) Filed: Sep. 23, 2023

(65) Prior Publication Data
US 2024/0118665 A1 Apr. 11, 2024

(30) Foreign Application Priority Data
Oct. 3, 2022 (FR) ........................... 2210093

(51) Int. Cl.
*G04F 10/10* (2006.01)
(52) U.S. Cl.
CPC .................... *G04F 10/10* (2013.01)
(58) Field of Classification Search
None
See application file for complete search history.

(56) References Cited

U.S. PATENT DOCUMENTS

| 6,320,435 | B1* | 11/2001 | Tanimoto | H03L 7/18 |
| | | | | 327/156 |
| 8,847,804 | B2* | 9/2014 | Braswell | H03M 3/344 |
| | | | | 341/143 |
| 9,588,497 | B1* | 3/2017 | Monk | H03L 7/093 |
| 2007/0075787 | A1* | 4/2007 | Jensen | H03L 7/093 |
| | | | | 331/17 |
| 2007/0189430 | A1* | 8/2007 | Chang | H03L 7/093 |
| | | | | 375/376 |
| 2009/0189655 | A1* | 7/2009 | Higashi | H03L 7/0995 |
| | | | | 327/158 |

(Continued)

FOREIGN PATENT DOCUMENTS

GB 1436851 A 5/1976

OTHER PUBLICATIONS

Goux, Nicolas, Jean-Baptiste Casanova, Gaël Pillonnet, and Franck Badets. "A 6-nW 0.0013-mm² ILO Bandpass Filter for Time-Based Feature Extraction." IEEE Solid-State Circuits Letters 3 (2020): 306-309.

(Continued)

*Primary Examiner* — Muhammad Adnan
(74) *Attorney, Agent, or Firm* — Jordan IP Law, LLC

(57) ABSTRACT

The present disclosure relates to a converter (1) converting a voltage (Vin) into time. The converter comprises a direct path (100) including a first injection-locked oscillator (104) and a first circuit (106). The first circuit is configured for receiving an output signal (Φsens) of the first oscillator and a reference signal (Φ0), and for providing at least a first pulse signal (out) determined by a phase shift between the output signal (Φsens) of the first oscillator and the reference signal (Φ0). The converter further comprises a feedback loop (102) comprising a second circuit (108) configured for integrating said at least one first pulse signal (out).

15 Claims, 5 Drawing Sheets

(56) References Cited

U.S. PATENT DOCUMENTS

| | | | | |
|---|---|---|---|---|
| 2014/0117955 | A1* | 5/2014 | Zoso | H02M 3/157 |
| | | | | 323/271 |
| 2014/0176205 | A1* | 6/2014 | Nakura | H03L 7/099 |
| | | | | 327/100 |
| 2016/0238998 | A1* | 8/2016 | Pavlovic | H03C 3/0941 |
| 2016/0241301 | A1* | 8/2016 | Pavlovic | H03C 3/0941 |
| 2017/0187383 | A1* | 6/2017 | Lesso | H03L 7/099 |
| 2021/0376841 | A1* | 12/2021 | Okada | H03B 5/02 |
| 2021/0384830 | A1* | 12/2021 | Bertolini | H02M 1/0025 |
| 2023/0163768 | A1* | 5/2023 | Lee | H03M 1/1014 |

OTHER PUBLICATIONS

Chabchoub, Emna, Franck Badets, Mohamed Masmoudi, Pascal Nouet, and Frédérick Mailly. "Highly linear voltage-to-time converter based on injection locked relaxation oscillators." In 2017 14th International Multi-Conference on Systems, Signals & Devices (SSD), pp. 733-737. IEEE, 2017.

Preliminary Search Report for French Application No. 2210093 dated Apr. 13, 2023, 3 pages.

Kim, Kwantae, Chang Gao, Rui Graça, Ilya Kiselev, Hoi-Jun Yoo, Tobi Delbruck, and Shih-Chii Liu. "A 23μW solar-powered keyword-spotting ASIC with ring-oscillator-based time-domain feature extraction." In 2022 IEEE International Solid-State Circuits Conference (ISSCC), vol. 65, pp. 1-3. IEEE, 2022.

Gutierrez, Eric, Carlos Perez, Fernando Hernandez, and Luis Hernandez. "Time-encoding-based ultra-low power features extraction circuit for speech recognition tasks." Electronics 9, No. 3 (2020): 418.

* cited by examiner

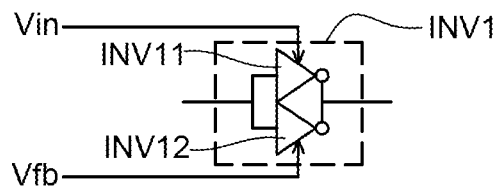
Fig. 9
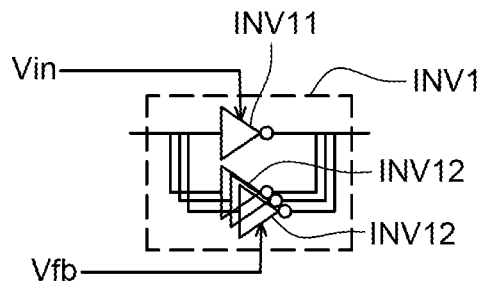
Fig. 10
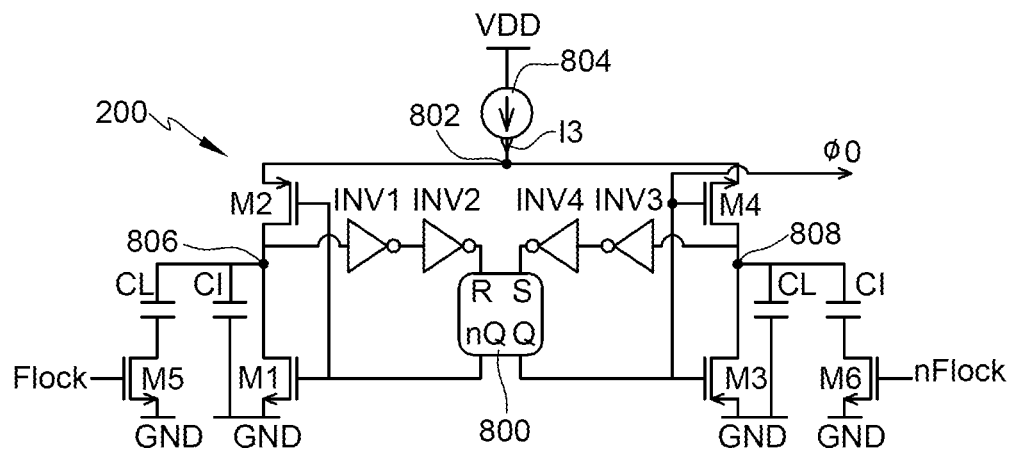
Fig. 11
Fig. 12

ANALOG-TO-TIME CONVERTER

FIELD

The present disclosure relates in general to electronic circuits, for example integrated circuits, and more particularly to circuits for converting an analog voltage into time, or analog-to-time converters.

BACKGROUND

An analog-to-time converter is configured for converting the value of an analog voltage into a time representative of said value, for example into a pulse signal having pulses each lasting a time representative of the value of the converted voltage.

Such a pulse signal is more robust against the variations of supply voltage and, more generally, against the PVT (Process Voltage Temperature) variations, than the analog voltage to which the signal corresponds. Furthermore, the circuits using such a pulse signal are almost entirely digital, benefit from a better noise margin, and reduced complexity, consumption and cost, compared to the corresponding analog circuits which would directly use the analog voltage. Thereby, analog-to-time converters are for example particularly suitable for being used in low-power circuits, such as for example battery-powered circuits comprising for example sensors supplying a voltage to be converted.

Furthermore, it is possible to use analog-to-time converters comprising a band-pass filter function, which reduces the complexity of an integrated circuit comprising such an Analog-to-Time Converter Band Pass Filter (ATC BPF).

Band-pass filter analog-to-time converters are known.

The article "Time-encoding-based ultra-low power features extraction circuit for speech recognition tasks" by Gutierrez et al, Electronics (Switzerland), 9(3), presents an analog-time converter with band-pass filter. However, the resonant frequency of such band-pass filter is defined by the transduction gain and by the free oscillation frequencies of the ring oscillators, which are two parameters sensitive to variations of process and of temperature. Furthermore, voltage-controlled ring oscillators suffer from non-linearity between the control voltage same receive and the frequency of the signal same supply, and can further be mismatched with respect to one another. The adjustment of the gain and/or resonant frequency of the filter is thereby complicated.

The article "A 23 µw Solar-Powered Keyword-Spotting ASIC with Ring-Oscillator-Based Time-Domain Feature Extraction" by Kim et al, IEEE Solid-State Circuits Conference (2022) attempts to limit the frequency mismatch of the free oscillation of the ring oscillators of the converter of the previous article by using phase-locked loops. However, the above results in an increase in complexity and in consumption.

The article "A 6-nW 0.0013-mm ILO Bandpass Filter for Time-Based Feature Extraction", by Goux et al, IEEE Solid-State Circuits Letters, 3, 306-309, presents a converter using Injection-Locked Oscillators (ILO) rather than voltage-controlled ring oscillators. It is in this way possible to prevent frequency drifts due to the PVT variations the voltage-controlled ring oscillators are subjected to. Furthermore, the band-pass filter function is implemented by combining a low-pass filter used by an injection-locked oscillator and a high-pass filter. However, the band-pass transfer function resulting therefrom does not have a complex pole, which limits the quality factor of the band-pass filter to values less than 0.5. Furthermore, the conversion gain of such architecture depends on the resonant frequency of the band-pass filter, which means that it is complex to change the resonant frequency of the band-pass filter without changing the conversion gain.

More generally, known band-pass filter analog-to-time converters have many drawbacks.

SUMMARY

There is a need to overcome all or some of the drawbacks of known band-pass filter analog-to-time converters, such drawbacks being for example a low quality factor and/or the complexity of adjusting the resonant frequency of the filter and/or the drift with PVT variations.

One embodiment addresses all or some of the drawbacks of known band-pass filter analog-to-time converters.

One embodiment provides for a voltage-to-time converter, the converter comprising:
  a direct path comprising a first injection-locked oscillator and a first circuit, the first circuit being configured for receiving an output signal of the first oscillator and a reference signal, and for providing at least a first pulse signal determined by a phase shift between the output signal of the first oscillator and the reference signal; and
  a feedback loop comprising a second circuit configured for integrating said at least a first pulse signal,
  wherein the first oscillator is configured for being controlled by a difference between the voltage to be converted and an output voltage of the feedback loop, the output voltage of the feedback loop being determined by an output voltage of the second circuit representative of the integration of said at least one first pulse signal, the feedback loop and the direct path being for example configured so that a loopback of the feedback loop on the direct path implements a negative feedback.

According to one embodiment, the first oscillator is a voltage-controlled phase shifter.

According to one embodiment, said at least one first pulse signal comprises pulses each lasting a time determined by the phase shift between the output signal of the first oscillator and the reference signal.

According to one embodiment:
  the first oscillator is configured for receiving a periodic signal at a locking frequency of the first oscillator, and so that said voltage difference determines a phase shift between the output signal of the first oscillator and the periodic signal.

According to one embodiment, the reference signal and the first circuit are configured for compensating for a fixed phase shift caused by the first oscillator between the periodic signal at the locking frequency and the output signal of the first oscillator.

According to one embodiment, the converter comprises a second injection-locked oscillator configured for receiving the periodic signal and for providing the reference signal.

According to one embodiment, the converter comprises two identical second injection-locked oscillators looped back one on the other and configured for supplying the periodic signal and the reference signal.

According to one embodiment:
  the voltage to be converted is a first component of a differential signal comprising a second component;
  the converter further comprises a third circuit identical to the second circuit, configured for integrating the at least one first pulse signal, preferentially in a complementary way with respect to the second circuit; and the converter comprises a second injection-locked oscillator identical to the first oscillator, the second oscillator being configured for providing the reference signal and a voltage difference between the second component and a voltage determined by an output voltage of the third circuit determines a phase shift between the reference signal and the first periodic signal.

According to one embodiment:

the voltage to be converted is a first component of a differential signal comprising a second component;

the converter comprises a second injection-locked oscillator and a third circuit, the third circuit being configured for receiving an output signal from the second oscillator and the periodic signal, and for providing at least a second pulse signal determined by a phase shift between the output signal from the second oscillator and the periodic signal;

the converter comprises a fourth circuit configured for integrating the at least one second pulse signal; and the second oscillator is configured for receiving the reference signal and such that a phase shift between its output signal and the reference signal is determined by a voltage difference between the second component and a voltage determined by an output voltage of the fourth circuit.

According to one embodiment, the converter comprises two identical third injection-locked oscillators, looped back on one another and configured for supplying the periodic signal and the reference signal with a phase shift of $\pi/2$ with respect to the periodic signal.

According to one embodiment:

the first and second oscillators are identical;

the first and third circuits are identical; and the second and fourth circuits are identical.

According to one embodiment, the converter is configured so that the locking frequency is in the middle of a locking range of the first oscillator.

According to one embodiment:

said at least one first pulse signal comprises two first pulse signals;

the first circuit comprises a phase detector configured for supplying the two first pulse signals.

According to one embodiment, the second circuit is a charge pump.

According to one embodiment, each oscillator is a relaxation oscillator comprising an S-R flip-flop configured for controlling charging and discharging phases in two capacitors, and for being controlled on the basis of the voltages across said two capacitors.

BRIEF DESCRIPTION OF THE DRAWINGS

The foregoing features and advantages, as well as others, will be described in detail in the following description of specific embodiments given by way of illustration and not limitation with reference to the accompanying drawings, wherein:

FIG. 9 illustrates a variant of embodiment of the circuit shown in FIG. 8;

FIG. 10 illustrates yet another variant of embodiment of the circuit shown in FIG. 8;

FIG. 11 illustrates an example of an embodiment of a circuit of the converter shown in FIGS. 1 to 4;

FIG. 12 illustrates an example of an embodiment of a circuit of the converter shown in FIGS. 1 to 4;

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
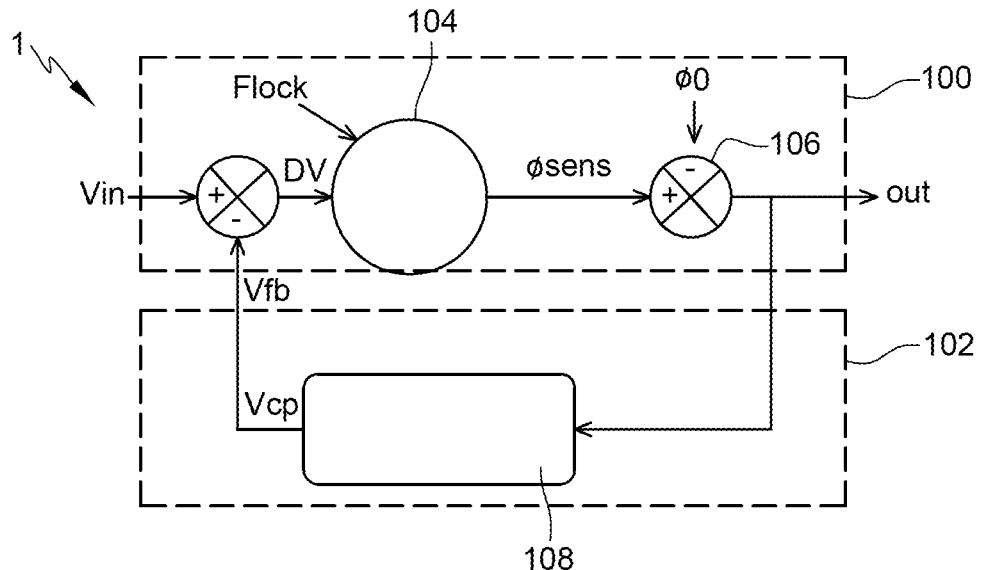
FIG. 1 illustrates, in the form of blocks, an embodiment of a band-pass filter analog-to-time converter.

FIG. 1 illustrates, in the form of blocks, an embodiment of a band-pass filter analog-to-time converter 1. More particularly, the converter 1 is configured for converting a voltage Vin into time, for example by converting the voltage Vin into one or a plurality of pulse signals out having pulses lasting times determined by the value of the voltage Vin. To simplify the reading of the remainder of the description, the expression "the signal out" means, unless otherwise specified or indicated, "the signal or the signals out".

The converter 1 comprises a direct path 100 (delimited by dotted lines in FIG. 1) and a feedback loop 102 (delimited by dotted lines in FIG. 1). The voltage Vin is for example supplied at the input of the direct path 100, and thus at the input of the converter 1. The signal out is for example provided at the output of the direct path 100, hence at the output of the converter 1. The signal out is for example provided at the input of the feedback loop 102. The return path 102 supplies for example an output signal Vfb, the signal Vfb being for example supplied to the direct path, for example to be subtracted from the voltage Vin. As an example, the signal Vfb and the loopback of the feedback 102 to the input of the direct path 100 are configured for having a negative feedback.

The direct path 100 comprises an injection-locked oscillator 104 and a circuit 106. The circuit 106 is configured for receiving an output signal Φsens from the oscillator 104 and a reference signal Φ0. The circuit 106 is further configured for supplying at least one pulse signal out determined by a phase shift between the signal Φsens and the signal Φ0. More precisely, the signal out comprises pulses each lasting a time determined by the value of the voltage Vin. As an example, the signal Φ0 represents a fixed phase shift with respect to the signal Flock, for example equal to π/2, making it possible to cancel a fixed phase shift, for example equal to π/2, caused by the oscillator 104 between Flock and Φsens. In other words, the signal Φ0 is configured for compensating for a fixed phase shift caused by the oscillator 104.

The feedback loop 102 comprises a circuit 108 configured for integrating the signal out. The circuit 108 is configured for supplying a signal Vcp corresponding to such integration, for example a voltage Vcp the value of which varies with the duration of the pulses of the signal out. The circuit 108 is for example configured for accumulating the pulse widths of the signal out, or, in other words, is a pulse width accumulator. According to one embodiment, the circuit 108 comprises a charge pump, for example a charge pump controlled by the pulses of the signal out. Since the circuit 108 is an integrator, the transfer function H1 thereof can be written H1=K1/s, with K1 the gain of the circuit 108 and s the Laplace variable, sometimes also denoted by p instead of s.

As is known to a person skilled in the art, an injection-locked oscillator, for example the oscillator 104 shown in FIG. 1, is an oscillator which, in the absence of a locking signal Flock, i.e. a periodic signal at a locking frequency Flock, provides a periodic signal at a frequency f0 called the natural frequency of the oscillator. When the oscillator receives the signal Flock, the oscillator locks at the frequency Flock and the frequency of the periodic signal provided by the oscillator becomes equal to Flock, with a fixed phase shift relative to the signal Flock. It should be noted that the frequency Flock has to be sufficiently close to the frequency f0 for the oscillator to lock at the frequency Flock, i.e. the frequency Flock has to be within the locking range of the oscillator. Indeed, the value of the fixed offset caused by an injection-locked oscillator, for example the oscillator 104, between Flock and output thereof (in the absence of a voltage control DV) is limited to a given range of values ranging for example from 0 to π. Since the value of the fixed phase shift depends on Flock, choosing a given value Flock makes it possible to set the value of the fixed phase shift caused by the oscillator 104. In particular, according to one embodiment, the frequency Flock is chosen to be in the middle of the locking range of the oscillator 104, which allows the converter 1 to have a dynamic range of phase shift symmetrical with respect to a central value of the range of possible values for the fixed shift caused by the oscillator 104. For example, Flock is chosen so that the fixed phase shift caused by the oscillator 104 between Flock and Φsens is equal to π/2 when the possible range of values of the fixed phase shift goes from 0 to π.

Furthermore, the oscillator 104 is voltage-controlled. More precisely, oscillator 104 is a voltage-controlled phase shifter.

According to one embodiment, the oscillator 104 is a relaxation oscillator comprising an S-R flip-flop, and for example two capacitors having voltages at the terminals thereof which determine the signals at the inputs of the S-R flip-flop and charging and discharging phases controlled by the outputs of the S-R flip-flop.

In FIG. 1, the oscillator 104 is controlled by a voltage difference DV between the voltage Vin to be converted and the output voltage Vfb of the feedback loop 102, i.e. the voltage Vfb supplied by the feedback loop 102 and determined by the output voltage Vcp of the circuit 108. For example, the voltage Vfb is equal to the voltage Vcp as illustrated in FIG. 1. The control voltage DV modifies the natural frequency f0 of the oscillator 104, resulting in a variable phase shift DΦ between the signal Φsens supplied by the oscillator 104 and the signal Flock, which depends on the voltage DV and therefore on the voltage Vin. In other words, the voltage DV, and hence the voltage Vin, controls or determines the variable phase shift DΦ between the signal Flock and the signal Φsens. In the example shown in FIG. 1, the oscillator 104 receives the voltage DV as a control voltage, the latter being for example supplied by a subtractor circuit comprising an operational amplifier. In other examples, the oscillator 104 directly receives the voltage Vin and the voltage Vfb, and is controlled by said two voltages. In other words, the oscillator 104 is configured so that the variable phase shift DΦ between the signal Flock and the signal Φsens is determined by the difference between the voltage Vin and the voltage Vfb. Although in the example shown in FIG. 1, the circuit 104 is controlled directly by a difference between the voltages Vin and Vfb by directly receiving the voltage DV, in other examples, the oscillator 104 is controlled by a difference between the voltages Vin and Vfb by directly receiving the voltages Vin and Vfb.

An advantage of the oscillator 104 is that the phase shift DΦ varies linearly with the voltage DV and hence with the voltage Vin, the phase shift DΦ then being representative of, or determined by, the value of the voltage DV, and hence the value of the voltage Vin. However, when the variations of the frequency Vin are too quick, i.e. when such variations are at frequencies higher than the locking frequency Flock of the oscillator 104, such variations are filtered by the oscillator 104, which then acts or functions as a low-pass filter with a cutoff frequency fc lower than Flock. Thereby, the transfer function H2 of the oscillator 104 can be written H2=K2/(1+(s/(2·π·fc))), with K2 the gain of the oscillator 104 and s the Laplace variable.

With H1=K1/s, the transfer function H3 of the converter 1 can be written H3=(K2·s)/(K1·K2+s+(s²/(2·π·fc))), the resonant frequency fres of the converter 1 being defined by the following relation: 2·π·fres=(K1·K2·2·π·fc)^0.5. The following band-pass operation of the converter 1 results therefrom.

For variations of the voltage Vin at low frequencies lower than the resonant frequency fres (or central frequency fres) of the band-pass filter, or, in other words, for s less than 2·π·fres, for example at least ten times less than 2·π·fres, the terms s and (s²/(2·π·fc) are considered negligible compared to the term K1·K2, and the transfer function H3 is substantially equal to s/K1, which corresponds to the transfer function of a differentiator, hence of a high-pass filter. In practice, for low frequencies, the signal Vin is compensated by the negative feedback loop 102, and the output signal out is strongly attenuated.

When the frequencies of the variations of the voltage Vin become greater than the frequency fc and approach the frequency fres, the oscillator 104 begins to attenuate the signal and to cause a phase shift between the signal Vin and the signal out until the signal out is phase shifted by $\pi/2$ with respect to the signal Vin. The signal out is supplied to the feedback loop 102 where the circuit 108 causes a phase shift of $-\pi/2$, thereby using a positive feedback. The signal out reaches a maximum at the resonant frequency fres of the band-pass filter, i.e. when s is equal to $2\cdot\pi\cdot$fres, and the transfer function H3 is then equal to the gain K2.

For variations in the voltage Vin having frequencies higher than the resonant frequency fres of the filter, or, in other words, for s greater than $2\cdot\pi\cdot$fres, for example at least ten times greater than $2\cdot\pi\cdot$fres, the terms K1·K2 and s are considered negligible compared to the term $(s^2/(2\cdot\pi\cdot fc))$, and the transfer function H3 is substantially equal to $(K2\cdot 2\cdot\pi\cdot fc)/s$, or, by replacing the term $2\cdot\pi\cdot fc$ by $(2\cdot\pi\cdot fres)^2/(K1\cdot K2)$, to $((2\cdot\pi\cdot fres)^2/K1)/s$, which corresponds to the transfer function of an integrator, hence of a low-pass filter. In practice, for frequencies higher than the frequency fres, the gain of the circuit 108 decreases away from the frequency fres, the converter 1 loses the closed loop properties thereof and the oscillator 104 attenuates the signal Vin.

As a result, the converter 1 indeed behaves like a band-pass filter wherein:
- the resonance frequency fres of the filter is equal to $(K1\cdot K2\cdot 2\cdot\pi\cdot fc)^{0.5}/(2\cdot\pi)$;
- the denominator of the transfer function H3 has two poles which can be complex, which means that the quality factor Q of the band-pass filter is not limited to values below 0.5;
- the quality factor Q is equal to $(K1\cdot K2/(2\cdot\pi\cdot fc))^{0.5}$, and can thus easily be chosen equal to values greater than 0.5;
- the gain at the frequency fres corresponds to the gain K2, and is thus independent of the frequency fres. It results therefrom that the frequency fres can be modified without same modifying the gain of the band-pass filter; and
- the operations of analog-to-time conversion and of band-pass filter are implemented in only one step, which reduces the consumption and complexity of the converter 1 compared with a circuit where the analog-to-time conversion operation would be implemented in the first step and the band-pass filter would be implemented during another step.

Figure 2:
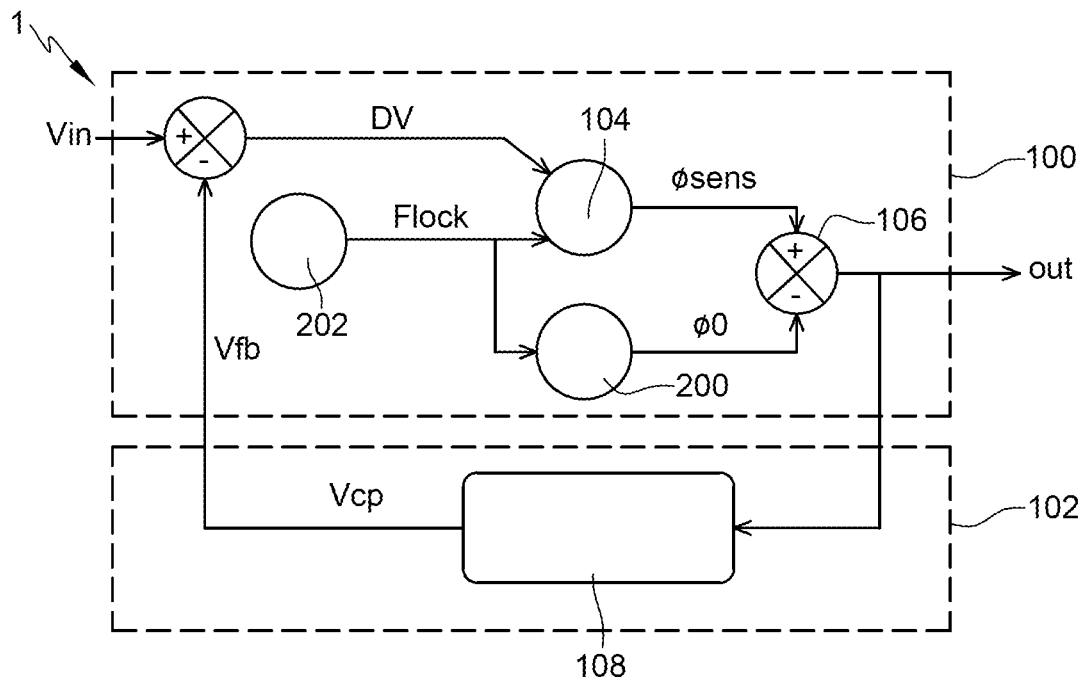
FIG. 2 illustrates, in the form of blocks, a more detailed embodiment of the converter shown in FIG. 1.

FIG. 2 illustrates, in the form of blocks, a more detailed embodiment of the converter 1 shown in FIG. 1. Only the differences between the converter 1 shown in FIG. 1 and the converter shown in FIG. 2 are described herein.

More particularly, FIG. 2 illustrates an embodiment of circuits used for supplying the signal Flock and the signal $\Phi 0$.

Thereby, in FIG. 2, the converter 1 comprises an injection-locked oscillator 200. More particularly, the oscillator 200 is for example an injection-locked relaxation oscillator. The oscillator 200 is configured for receiving the signal Flock as a locking signal, and for supplying the signal $\Phi 0$, for example with a phase shift with respect to the signal Flock configured for compensating for the fixed phase shift caused between Flock and $\Phi$sens, for example with a phase shift of $\pi/2$ with respect to the signal Flock. In other words, the oscillator 200 and the circuit 106 are configured for compensating for the fixed phase shift caused by the oscillator 104 between Flock and $\Phi$sens.

According to one embodiment, the oscillator 200 is a relaxation oscillator, for example a relaxation oscillator comprising an S-R flip-flop.

According to one embodiment, the oscillator 200 is similar to the oscillator 104, except that same is not voltage-controllable, or in other words, that same does not comprise the means of voltage-control that the oscillator 104 comprises.

Moreover, in FIG. 2, the converter comprises an oscillator 202 configured for supplying the signal Flock. More particularly, the oscillator 202 is for example an oscillator without the injection-locking function and the voltage-control function.

According to one embodiment, the oscillator 202 is a relaxation oscillator, for example a relaxation oscillator comprising an S-R flip-flop.

According to one embodiment, the oscillator 202 is similar to the oscillator 104, except that same cannot be voltage-controlled or, in other words, that same does not comprise the means of voltage-control that the oscillator 104 comprises, and that same does not comprise the means, for example the components, of locking the frequency of the signal Flock supplied by the oscillator 202 on a locking signal at a locking frequency.

Figure 3:
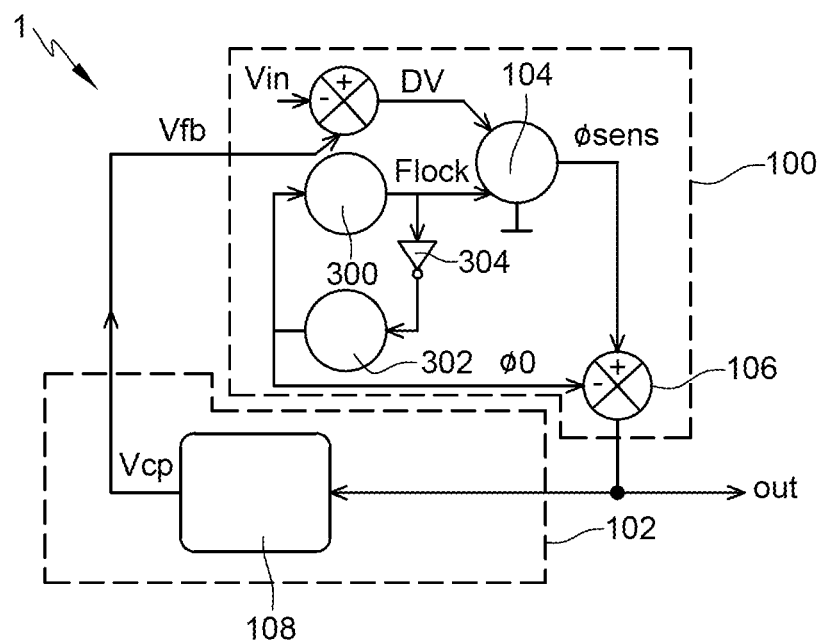
FIG. 3 illustrates, in the form of blocks, a variant embodiment of the converter shown in FIG. 2.

FIG. 3 illustrates, in the form of blocks, a variant of embodiment of the converter 1 shown in FIG. 2, and more particularly, a variant of embodiment of circuits used for supplying the signal Flock and the signal $\Phi 0$. Only the differences between the converters shown in FIGS. 2 and 3 are described herein.

In the converter 1 shown in FIG. 3, the oscillators 200 and 202 are replaced by two identical oscillators 300 and 302 looped back one on the other and configured for supplying the two signals Flock and $\Phi 0$. The oscillators 300 and 302 are injection-locked oscillators, for example without the voltage-control function.

More particularly, the oscillator 300 supplies the signal Flock to an inverter 304, the inverter supplies an output signal Flockb to the oscillator 302, the oscillator 302 supplying the signal $\Phi 0$ the oscillator 300. The signal Flockb thus serves as a locking signal for the oscillator 300 and the signal $\Phi 0$ serves as a locking signal for the oscillator 302.

The oscillators 300 and 302 and the inverter 304 form a structure called self-injection-locked oscillators.

According to one embodiment, each oscillator 300, 302 is a relaxation oscillator, for example a relaxation oscillator comprising an S-R flip-flop.

According to one embodiment, each oscillator 300, 302 is similar to the oscillator 104, with the difference that same cannot be voltage-controlled, or, in other words, that it does not comprise the means of voltage-control that the oscillator 104 comprises.

Figure 4:
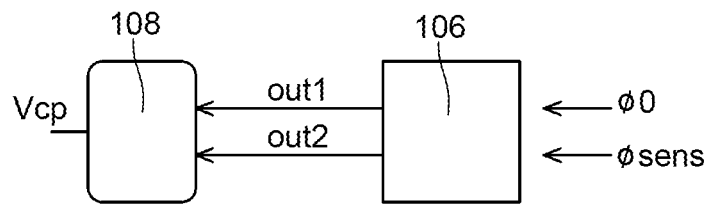
FIG. 4 illustrates, in the form of blocks, an embodiment of a part of the converter shown in FIGS. 1 to 3.

FIG. 4 illustrates, in the form of blocks, an embodiment of a part of the converter 1 shown in FIGS. 1 to 3, and more particularly an embodiment of the circuits 106 and 108.

In such embodiment, the circuit 106 is configured for receiving the signals $\Phi 0$ and $\Phi$sens, and for supplying two pulse signals out1 and out2 representative of the phase shift between the signals $\Phi 0$ and $\Phi$sens. In other words, in FIG. 4, the signal out comprises two pulse signals out1 and out2.

As a more particular example, when the signal $\Phi 0$ has a phase advance over the signal $\Phi$sens, the circuit 106 is herein configured for supplying pulses out1. The signal out2 is then preferentially in a rest state, i.e. same does not have any pulse. Furthermore, the pulses out1 have durations determined by the phase shift between the signals Φ0 and Φsens. Symmetrically, when the signal Φsens has a phase advance over the signal Φ0, the circuit 106 is herein configured for supplying pulses out2. The signal out1 is then preferentially in a rest state, i.e. same does not have any pulse. Furthermore, the pulses out2 have durations determined by the phase shift between the signals Φ0 and Φsens.

According to one embodiment, the circuit 106 comprises a phase detector (not shown in FIG. 4). For example, an input of the phase detector, for example an input In1 of the phase detector, is configured for receiving a signal determined by the signal Φ0, for example the signal Φ0 as such, and another input of the phase detector, for example an input In2, is configured for receiving a signal determined by the signal Φsens, for example the signal Φsens as such. In other words, one input of the phase detector is controlled on the basis of the signal Φ0, the other input of the phase detector being controlled on the basis of the signal Φsens. An output of the phase detector, for example an output O1 activated by the input In1, is configured for supplying the signal out1, another output of the phase detector, for example an output O2 enabled by the input In2, being configured for supplying the signal out2.

In the embodiment shown in FIG. 4, the circuit 108 is configured for receiving the signals out1 and out2.

According to one embodiment, the circuit 108 is configured for supplying the voltage Vcp such that the voltage Vcp varies linearly in a first direction only during the time of each pulse of the signal out1, and varies linearly in a second direction opposite to the first direction only during the time of each pulse of the signal out2. Preferentially, the slope of variation of the voltage Vcp is, in absolute value, identical for the first and second directions of variation. The direction of variation of the voltage Vcp with the pulses out1 and out2 received by the circuit 108 is determined so that the loopback of the path 102 to the input of the direct path 100 (FIG. 1) implements a negative feedback. More generally, the direction of variation of the output voltage Vfb of the feedback loop 102 as a function of the output signal out of the direct path 100 is configured so that the loopback of the path 102 to the path 100 implements a negative feedback.

According to one embodiment, the circuit 108 comprises a charge pump configured for receiving the signals out1 and out2, and for supplying the voltage Vcp on the basis of the signals out1 and out2. The signals out1 and out2 are then charge pump control signals. The charge pump comprises for example two sources of current configured for charging and discharging, respectively, a capacitor, the voltage Vcp being available between the terminals of the capacitor, one of the signals out1 and out2 selectively coupling a first of the two sources of current to the capacitor, and the other of the signals out1 and out2 selectively coupling a second of the two sources of current to the capacitor.

As an example, when the converter 1 comprises a circuit configured for generating the voltage DV by subtracting the voltage Vfb from the voltage Vin, the voltage Vcp increases during the pulses out1 and decreases during the pulses out2. In other words, the circuits 106 and 108 are configured so that the voltage Vcp increases when the signal Φ0 is in phase advance with respect to the signal Φsens, and decreases when the signal Φ0 is in phase lag with respect to the signal Φsens. It is thereby possible, for example, that the feedback loop 102 is a negative feedback loop. In other examples where the oscillator 104 is not controlled directly by the voltage DV but on the basis of a difference between the voltages Vfb and Vin, the oscillator then directly receiving the voltages Vfb and Vin, so that the feedback loop is a negative feedback loop, the circuits 106 and 108 are configured so that the voltage Vcp decreases when the signal Φ0 is in phase advance with respect to the signal Φsens, and increases when the signal Φ0 is in phase lag with respect to the signal Φsens.

Figure 5:
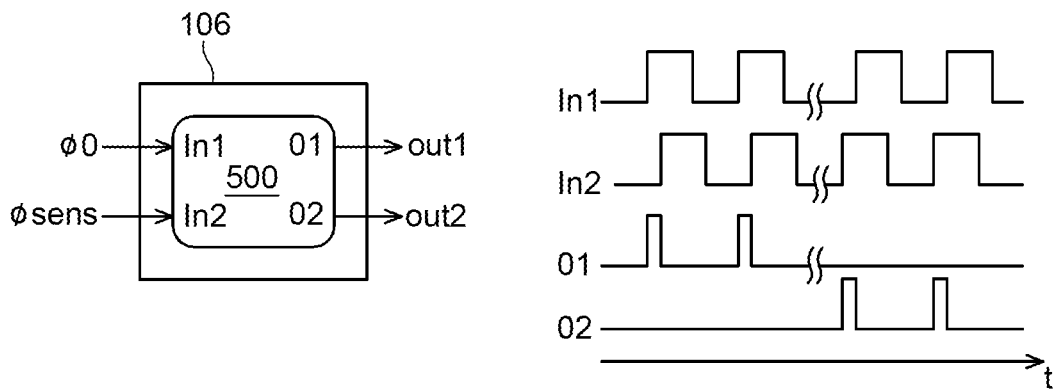
FIG. 5 illustrates an example of use of a circuit shown in FIG. 4.

FIG. 5 illustrates an example of use of the circuit 106 shown in FIG. 4 (on the left in FIG. 5) and an example of operation of the circuit 106 (on the right in FIG. 5).

In such example of embodiment, the circuit 106 comprises a phase detector as described hereinabove and having the reference 500 in FIG. 5, and, more particularly, is used only by the phase detector 500.

In such example, the phase detector 500 receives the signal Φ0 at the input In1 thereof, and the signal Φsens on the input In2 thereof. In such example, the inputs In1 and In2 are active on a rising edge, however, in other examples, the inputs are active on a falling edge.

The phase detector 500 comprises the two outputs O1 and O2 configured, in said example, for supplying the signals out1 and out2, respectively.

As illustrated by chronograms on the right in FIG. 5, in an initial state the inputs In1 and In2 are in the low state thereof and the outputs O1 and O2 are also in the low state thereof.

Starting from the initial state described hereinabove, when an active edge, herein a rising edge, is present at the input In1, same causes the switching of the output O1, herein to the high state, the output O2 remaining in the current state thereof, herein the low state. Then, when an active edge, herein a rising edge, is present at the input In2 whereas the input In1 has not yet switched to the initial state thereof, same causes the two outputs O1 and O2 to be reset to the initial state, i.e. herein that the output O1 switches to the low state thereof.

Symmetrically, starting from the initial state, when an active edge, herein a rising edge, is present at the input In2, same causes the switching of the output O2, herein to the high state, the output O1 remaining in the current state thereof, herein the low state. Then, when an active edge, herein a rising edge, is present at the input In1 whereas the input In2 has not yet switched to the initial state thereof, same causes the two outputs O1 and O2 to be reset to the initial state, i.e. herein that the output O2 switches to the low state thereof.

The output O1 is thus enabled by the input In1 and the output O2 is enabled by the input In2.

In other examples (not illustrated), the high and low states of the two outputs O1 and O2 can be inverted, i.e. the initial state of the outputs O1 and O2 is the high state.

Of course, the use of the circuit 106 is not limited to the examples described in relation to FIGS. 4 and 5, and a person skilled in the art is in a position, from the description of the operation of the converter 1 made with reference to FIGS. 1 to 3, other uses of the circuit 106 can be provided.

Figure 6:
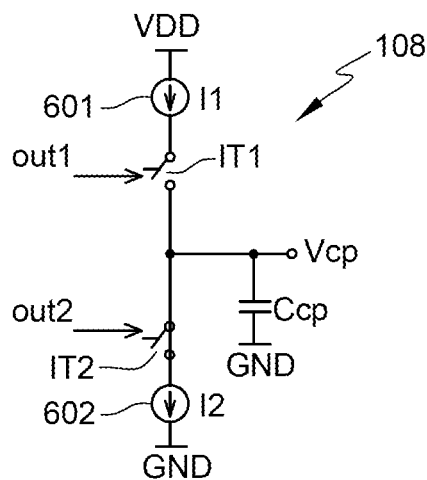
FIG. 6 illustrates an example of the use of another circuit shown in FIG. 4.

FIG. 6 illustrates an example of use of the circuit 108 shown in FIG. 4, for example in the case where the circuit 106 is implemented in the way illustrated by FIG. 5.

In the present example of embodiment, the circuit 108 is implemented by a charge pump.

The charge pump 108 comprises two sources of current 601 and 602 configured for delivering respective currents I1 and I2, two switches IT1 and IT2 controlled by the signals out1 and out2, for example by the signals out2 and out1, respectively, and a capacitor Ccp connected between an output of the circuit 108 and for example the ground GND. The voltage Vcp is available at the output of the circuit 108.

As an example, the source of current 601 is connected between a supply potential VDD, for example positive with respect to the ground GND, and a conduction terminal of the switch IT1, the other conduction terminal of the switch IT1 being connected to the output of the circuit 108, hence to the capacitor Ccp. Symmetrically, the source of current 602 is connected between the ground GND and a conduction terminal of the switch IT2, the other conduction terminal of the switch IT2 being connected to the output of the circuit 108, hence to the capacitor Ccp. The switch IT1 is, in this example, controlled by the signal out1 and is configured for being ON at each pulse of the signal out1, i.e. during each high state of the signal out1 in the present example. In a symmetrical manner, the switch IT2 is, in the present example, controlled by the signal out1 and is configured for being ON at each pulse of the signal out1, i.e. during each high state of the signal out1 in the present example.

Thus, in the present example, the voltage Vcp increases with each pulse of the signal out1 (Φ0 advances in phase ahead of Φsens) and decreases with each pulse of the signal out2 (Φ0 lags in phase behind Φsens). However, as has already been mentioned hereinabove, in order for the feedback loop 102 to implement a negative feedback, in other examples the voltage Vcp increases with each pulse of the signal out2 (Φ0 lags in phase behind Φsens) and decreases with each pulse of signal out1 (Φ0 advances in phase ahead of Φsens). In such other examples, the switches IT1 and IT2, are for example controlled by the signals out1 and out2, respectively.

As an example, in the case where I1 is equal to I2, the transfer function H1 of the circuit 108 can be written $H1=I1/(2 \cdot \pi \cdot Ccp \cdot s)$, from which it follows that K1 is then equal to $I1/(2 \cdot \pi \cdot Ccp)$. It can be seen that it is then easy to adjust the gain K1 by modifying the current I1 and/or the value of the capacitance Ccp.

Figure 7:
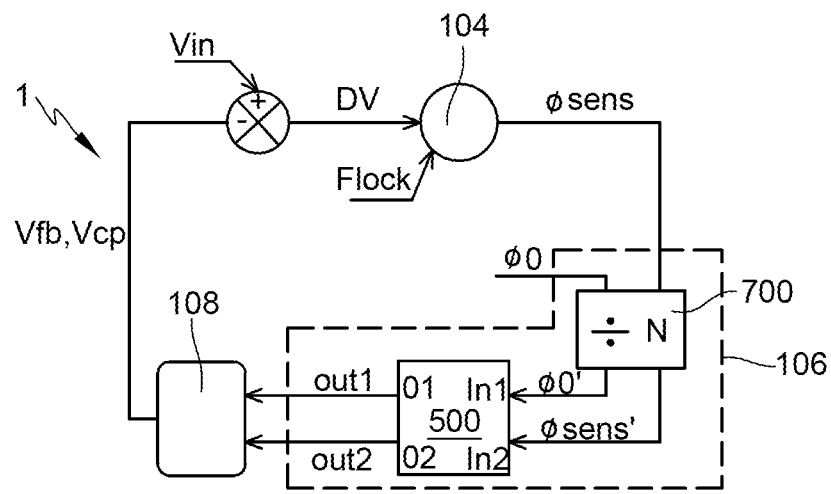
FIG. 7 illustrates, in the form of blocks, a variant of embodiment of the converter shown in FIGS. 1 to 4.

FIG. 7 illustrates, in the form of blocks, a variant of embodiment of the converter 1 shown in FIGS. 1 to 4, and more particularly, a variant of embodiment of the circuit 106 with respect to the embodiment described in relation to FIG. 5.

In said variant of embodiment, the circuit 106 comprises a phase detector, for example the phase detector 500 described in relation with FIG. 5, and a frequency divider by N, with the reference 700 in FIG. 7.

The phase detector 500 is controlled on the basis of the signals Φ0 and Φsens, by signals Φ0' and Φsens' obtained, with the circuit 700, by dividing by N the frequency of the respective signals Φ0 and Φsens.

The circuit 700 receives the signals Φ0 and Φsens and supplies the respective signals Φ0' and Φsens' having a frequency N times lower than the respective signals Φ0 and Φsens.

As an example, the signal Φ0' is received by the input S and the signal Φsens' is received by the input R.

The circuit 700 is used for increasing the gain K1 of the feedback loop (or return path) 102 (FIG. 1) by a factor N.

Figure 8:
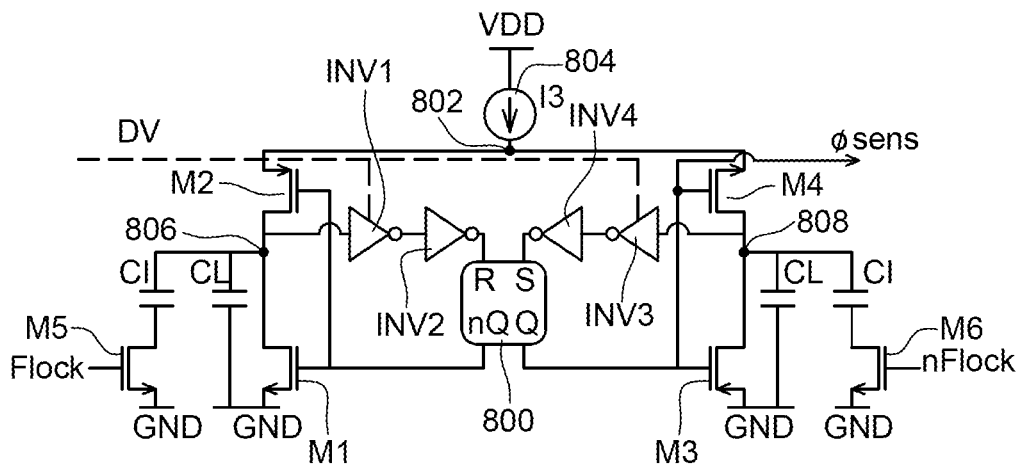
FIG. 8 illustrates an example of an embodiment of a circuit of the converter shown in FIGS. 1 to 4.

FIG. 8 illustrates an example of embodiment of the oscillator 104 of the converter 1 shown in FIGS. 1 to 4. In said example of embodiment, the oscillator is a relaxation oscillator comprising an S-R flip-flop 800. The operation of an S-R flip-flop is well known to a person skilled in the art and will not be discussed herein in detail. The flip-flop 800 comprises two inputs S and R, and two outputs Q and nQ enabled by the respective inputs S and R.

The oscillator 104 comprises two switches M1 and M2 in series between the ground GND and a node 802 coupled to the supply potential VDD by a source of current 804 delivering a current I3. The two switches M1 and M2 are controlled in phase opposition by the output nQ of the flip-flop 800. In other words, when the switches M1 and M2 are two MOS transistors, the transistors M1 and M2 have channels of opposite types and the gates thereof are coupled, preferentially connected, to the output nQ. The source of current 804 is for example connected between the node 802 and the potential VDD.

In the present example where the potential VDD is positive with respect to the ground GND, the transistor M1 is an N-channel transistor and has the source thereof connected to the ground GND, the transistor M2 is a P-channel transistor and has the source thereof connected to the node 802, and the transistors M1 and M2 have the drains thereof connected to the same node 806.

Symmetrically or as a supplement, the oscillator 104 comprises two switches M3 and M4 in series between the ground GND and the node 802. The two switches M3 and M4 are controlled in phase opposition by the output Q of the flip-flop 800. In other words, when the switches M3 and M4 are two MOS transistors, the transistors M3 and M4 have channels of opposite types and have the gates thereof coupled, preferentially connected, to the output Q.

In the present example where the potential VDD is positive with respect to the ground GND, the transistor M3 is an N-channel transistor and has the source thereof connected to the ground GND, the transistor M3 is a P-channel transistor and has the source thereof connected to the node 802, and the transistors M3 and M4 have the drains thereof connected to the same node 808.

The oscillator 104 comprises a capacitor CL connected between the node 806 and the ground GND. Symmetrically or as a supplement, the oscillator comprises another capacitor CL connected between the node 808 and the ground GND.

The oscillator 104 comprises a capacitor CI in series with a switch M5 between the node 806 and the ground GND. The switch M5 is controlled by the signal Flock. The switch M5 is for example a MOS transistor. In the present example, where VDD is positive with respect to ground GND, the transistor M5 is an N-channel transistor and has the source thereof coupled, for example connected, to ground GND, the drain thereof being coupled, for example connected, to node 806.

Symmetrically or as a supplement, the oscillator 104 comprises another capacitor CI in series with a switch M6 between the node 808 and the ground GND. The switch M6 is controlled by a signal nFlock complementary to the signal Flock. In other words, the signal nFlock is in the high state, respectively the low state, when the signal Flock is in the low state, respectively the high state. In other words, the switches M5 and M6 are controlled in phase opposition on the basis of the signal Flock. The switch M6 is for example a MOS transistor. In the present example, where VDD is positive with respect to ground GND, the transistor M6 is an N-channel transistor and has the source thereof coupled, for example connected, to ground GND, the drain thereof being coupled, for example connected, to node 808.

The input R of the flip-flop 800 is controlled on the basis of the signal available at the node 806. More particularly, an even number of inverters in series couple the node 806 to the input R. Preferentially, two inverters INV1 and INV2 in series couple the node 806 to the input R. The inverter INV1 is connected to the node 806.

Symmetrically or as a supplement to what has just been described, the flip-flop 800 is controlled on the basis of the signal available at the node 808. More particularly, an even number of inverters in series couple the node 808 to the input R. Preferentially, two inverters INV3 and INV4 in series couple the node 808 to the input S. The inverter INV3 is connected to the node 808.

In the absence of the capacitors CI and of the switches M5 and M6, the operation of the oscillator 104 is the operation of a relaxation oscillator comprising an S-R flip-flop, the S-R flip-flop controlling the charging and discharging of the capacitors CL. More particularly, when Q is in the low state, the switch M3 is open and the switch M4 is ON, which results in the capacitor CL connected to the node 808 being charged by the current I3. When the voltage of the node 808 reaches the switching threshold Vth of the inverter INV3, the input S receives a rising edge which switches the output Q to the high state. The above causes the switch M3 to switch to the ON state and the switch M4 to switch to the open state, which discharges to the ground GND the capacitor CL connected to the node 808. Symmetrically or as a supplement, when nQ is in the low state, the switch M1 is open and the switch M2 is ON, which results in the capacitor CL connected to the node 806 being charged by the current I3. When the voltage of the node 806 reaches the switching threshold Vth of the inverter INV1, the input R receives a rising edge which switches the output nQ to the high state. The above causes the switch M1 to switch to the ON state and the switch M2 to switch to the open state, which discharges to the ground GND the capacitor CL connected to the node 806.

The output $\Phi$sens of oscillator 104, which corresponds to the Q output of flip-flop S-R, then oscillates at the natural frequency f0 of the oscillator 104. In the present example of embodiment, the frequency f0 can be written $f0 = I3/(2 \cdot Vth \cdot CL)$.

The provision of the capacitors CI and of the switches M5 and M6 in the oscillator 104 as illustrated in FIG. 8 makes it possible to implement the injection locking function. More particularly, the value of each of the capacitances CL is modulated by the value of the associated capacitance CI, at the frequency Flock of the signal Flock. As a result, the signal $\Phi$sens starts to oscillate at the frequency Flock, with a fixed phase shift $\Phi$ with respect to the signal Flock. The phase shift $\Phi$ can be written $\Phi = \pi \cdot [1 + (1+\alpha) \cdot ((Flock/f0) - 1]$, with $\alpha$ equal to CLval/CIval, CLval being the value of each capacitance CL and CIval being the value of each capacitance CI.

In practice, the phase shift $\Phi$ is comprised between 0 and $\pi$. Thereby, the locking range wherein the frequency Flock has to be in order for the oscillator 104 to lock on said frequency, extends from $\alpha \cdot f0/(1+\alpha)$ which corresponds to a zero phase shift $\Phi$, to f0 which corresponds to a phase shift $\Phi$ of $\pi$. According to one embodiment, the frequency Flock is chosen to be in the middle of the locking range of the oscillator 104, and hence corresponds to a phase shift $\Phi$ of $\pi/2$.

Symmetrically, the output of oscillator 104 can be taken from the output nQ of the flip-flop rather than from the output Q thereof, from which it results that the fixed phase shift $\Phi$ between Flock and $\Phi$sens then belongs to a range going from $-\pi$ when Flock is equal to $\alpha \cdot f0/(1+\alpha)$, to 0 when Flock equals f0. In such case, Flock is preferentially chosen so that the fixed phase shift $\Phi$ caused by the oscillator 104 between Flock and $\Phi$sens is equal to $-\pi/2$. A person skilled in the art will be able to adapt the description to such example.

The oscillator 104 is a voltage-controlled phase shifter, for example controlled by the voltage difference DV. For this purpose, as represented by dashed lines in FIG. 8, the voltage is used for modulating the switching threshold Vth of the inverters INV1 and INV3 connected to the respective nodes 806 and 808. For example, the voltage DV is applied to the substrate of each of the inverters INV1 and INV3, from which it results that the threshold Vth of each of the inverters can be written $Vth = Vth0 + Kinv \cdot DV$, with Kinv the gain of the inverter and Vth0 the switching threshold of the inverter in the absence of voltage DV). As an example, the gain Kinv is negative (the threshold Vth varies in an opposite way to the voltage DV).

The cut-off frequency fc of the oscillator 104 can then be approximated by the ratio $Flock/(\Pi \cdot \alpha)$, and the gain K2 can be approximated by $\alpha \cdot Kinv \cdot \Pi/(Vth0)$.

In the example shown in FIG. 8, the oscillator 104, and more particularly the inverters INV1 and INV3, receive the voltage DV equal to the difference between the voltage Vin and the voltage Vfb, so that the oscillator 104 is controlled by the difference between the voltage Vin and the voltage Vfb. The above means that the converter 1 comprises a circuit configured for receiving the voltages Vfb and Vin and for supplying the voltage DV.

However, as has already been indicated with reference to FIG. 1, the oscillator 104 can receive the two voltages Vin and Vfb rather than the voltage DV, and be configured for being controlled by the difference between the voltage Vin and the voltage Vfb, for example as will now be described with reference to FIG. 9.

FIG. 9 illustrates a variant of embodiment of the voltage-controlled injection-locked oscillator 104 described with reference to FIG. 8, in the case where the oscillator receives the two voltages Vin and Vfb rather than the voltage DV. In FIG. 9, the oscillator 104 differs from the oscillator shown in FIG. 8 only in the use of the inverters INV1 and INV3. Only the inverter INV1 is shown in FIG. 9, the inverter INV3 being used in the same way and the rest of the oscillator 104 being similar or identical to what was described with reference to FIG. 8.

In such variant, the inverter INV1 is implemented by an inverter INV11 and an inverter INV12. The two inverters INV11 and INV12 are connected in parallel, or, in other words, have the inputs thereof connected to each other and the outputs thereof connected to each other.

The inverter INV1 (delimited by dashed lines in FIG. 9) is configured for receiving the two voltages Vin and Vfb. More particularly, the inverter INV11 is configured for receiving the voltage Vin and the inverter INV12 is configured for receiving the voltage Vfb.

Like the inverter INV1 described with reference to FIG. 8, which is configured so that the voltage DV modulates the switching threshold Vth thereof, the inverter INV11, respectively INV12, is configured so that the voltage Vin, respectively Vfb, modulates the switching threshold thereof. For example, the voltage Vin is applied to the substrate of inverter INV11 and the voltage Vfb is applied to the substrate of inverter INV12.

The inverters INV11 and INV12 are configured so that the modulation of the thresholds of the inverters INV11 and INV12 by the respective voltages Vin and Vfb results in a modulation of the threshold Vth of the inverter INV1 similar to the modulation of the threshold Vth of the inverter INV1 directly by the voltage DV, for example a modulation identical to a gain factor which depends on the number of inverters used for implementing the inverter INV1. For example, considering that the inverter INV1 described in relation with FIG. 8 is identical to each of the inverters INV11 and INV12 described in relation to FIG. 9, then the gain of the inverter INV1 shown in FIG. 9 will be twice smaller than the gain of the inverter INV1 shown in FIG. 8.

As an example, when the inverters INV1 and INV3 are used in the way described with reference to FIG. 9, and the circuits 106 and 108 are used in the way described with reference to FIGS. 4 to 6, in order for the inverters INV1 and INV3 to implicitly use the subtraction of the voltage Vfb from the voltage Vin, it suffices to invert the connection of the signals out1 and out2 to the switches IT1 and IT2 of the charge pump 108, so that the voltage Vcp decreases during the pulses out1, and increases during the pulses out2. In other words, the circuits 106 and 108 are then configured so that the voltage Vcp increases when the signal Φ0 lags in phase behind the signal Φsens and decreases when the signal Φ0 advances in phase ahead of the signal Φsens. It is thereby possible, for example, that the feedback loop 102 is a negative feedback loop.

FIG. 10 illustrates a variant of embodiment of the voltage-controlled injection-locked oscillator 104 described with reference to FIG. 8, in the case where the oscillator receives the two voltages Vin and Vfb rather than the voltage DV. In FIG. 10, the oscillator 104 differs from the oscillator shown in FIG. 8 only in the use of the inverters INV1 and INV3. Only the inverter INV1 is shown in FIG. 10, the inverter INV3 being used in the same way and the rest of the oscillator 104 being similar or identical to what was described with reference to FIG. 8.

More particularly, in FIG. 10, the use of the inverter INV1 differs from the use described in relation to FIG. 9 in that the inverter INV1 comprises a plurality of inverters INV12 connected in parallel and each having the switching threshold thereof modulated by the voltage Vfb.

In this way, the open loop gain of the converter 1 is divided with respect to the closed loop gain by a factor G depending on the number of inverters INV12. In other words, the above amounts to having a closed loop gain G times greater than the open loop gain. In terms of design, the above amounts to adding a gain stage G between the voltage Vcp and the voltage Vfb.

FIG. 11 illustrates an example of an embodiment of an injection-locked oscillator without voltage control, for example of the oscillator 200 shown in FIG. 2.

The oscillator 200 shown in FIG. 11 differs from the oscillator 104 shown in FIG. 8 in that same cannot be voltage-controlled, hence does not include the means which relate to the voltage control.

Thereby, the oscillator 200 shown in FIG. 11 differs from the oscillator 104 shown in FIG. 8 only in that the switching threshold Vth of the inverters INV1 and INV3 cannot be voltage-controlled, either by the voltage DV or by the two voltages Vin and Vfb.

Although FIG. 11 illustrates the oscillator 200 shown in FIG. 2, each of the oscillators 300, 302 shown in FIG. 3 can be implemented in the same way as the oscillator 200 shown in FIG. 2, by adapting, if need be, the control signals of the switches M6 and M7, and the output signal available at the output Q of the flip-flop 800.

FIG. 12 illustrates an example of embodiment of a relaxation oscillator, without injection locking and without voltage control, for example of the oscillator 202 shown in FIG. 2.

The oscillator 202 shown in FIG. 12 differs from the oscillator 104 shown in FIG. 8 in that same does not comprise the means for controlling the voltage of the switching thresholds of the inverters INV1 and INV3, and in that same does not comprise the means (or components) for the use of injection locking, i.e. the components CI, M5 and M6. Stated in another way, the oscillator 202 shown in FIG. 12 differs from the oscillator 200 shown in FIG. 11 in that same does not comprise means (or components) for implementing injection locking, i.e. the components CI, M5 and M6.

The value ClockVal of the capacitances CL of the oscillator 202 shown in FIG. 12 is adapted with respect to the value of the capacitances CL of the oscillators 200 and 104, so that the natural frequency Flock of the oscillator 200 is within the locking range of the oscillator 104.

According to a particular example of embodiment, the oscillator 104 is implemented in the way described with reference to FIG. 8 and the frequency Flock is chosen at the middle of the locking range of the oscillator 104, from which it results that the value ClockVal can be written ClockVal=CLval·((1+α)/(0.5+α)).

According to a particular example of embodiment, the oscillators 104, 200 and 202 of the converter 1 shown in FIG. 2 are used in the way described with reference to FIGS. 8, 11 and 13, with a control of the switching thresholds of the inverters INV1 and INV3 as described with reference to FIG. 9, and the circuits 106 and 108 are used in the way described with reference to FIGS. 5 and 6, by adapting the connection of the circuit 106 and 108 to the control of the inverters INV1 and INV3 by the two voltages Vin and Vfb. In such an example:

the resonant frequency fres of the converter 1 is written:

$$fres \approx \frac{1}{2\prod} \sqrt{\frac{Kinv \cdot (I1 \cdot I3)}{2 \cdot Vth0 \cdot CcpVal \cdot ClockVal}} = \frac{A}{2\prod} \sqrt{(I1 \cdot I3)} \quad [\text{Math 1}]$$

where CcpVal is the capacitance value of the capacitor Ccp of the charge 108 pump and A is a constant factor determined by Kinv, Vth0, CcpVal and ClockVal;

the quality factor Q of the converter 1 can be written:

$$Q \approx \alpha \cdot \sqrt{\frac{Kinv \cdot ClockVal \cdot I1}{2 \cdot CcpVal \cdot I3}} = B \cdot \alpha \quad [\text{Math 2}]$$

by making the currents I1 and I3 equal; and
the gain Gconv of the converter can be written:

$$Gconv = \frac{\alpha \cdot \prod \cdot Kinv}{Vth0} \quad [\text{Math 3}]$$

It can be seen that, in the above particular example, when the current I1 and I3 are equal, the value of the resonant frequency fres varies linearly with the current I1, and a modification of the current I1 (hence of the current I2 equal to I1 and of the current I3 equal to I1) does not modify Q and Gconv. Furthermore, fres is independent of α, and α can be used for modifying the quality factor Q which is linearly dependent on α.

In the embodiments and variants of embodiments of the converter 1, as described hereinabove, the voltage Vin is for example a single rail voltage, i.e. a non-differential voltage. However, a person skilled in the art is able to adapt the above description to examples wherein the voltage Vin is one of the two components Vn and Vp of a differential voltage Vindiff, for example by providing an analog-to-time converter comprising the converter 1 for converting the voltage Vin, i.e. the first component Vn of voltage Vindiff, and at least one other oscillator 104' identical to the oscillator 104 and another integrator circuit 108' identical to circuit 108, for converting the second component Vp of the voltage Vindiff.

Figure 13:
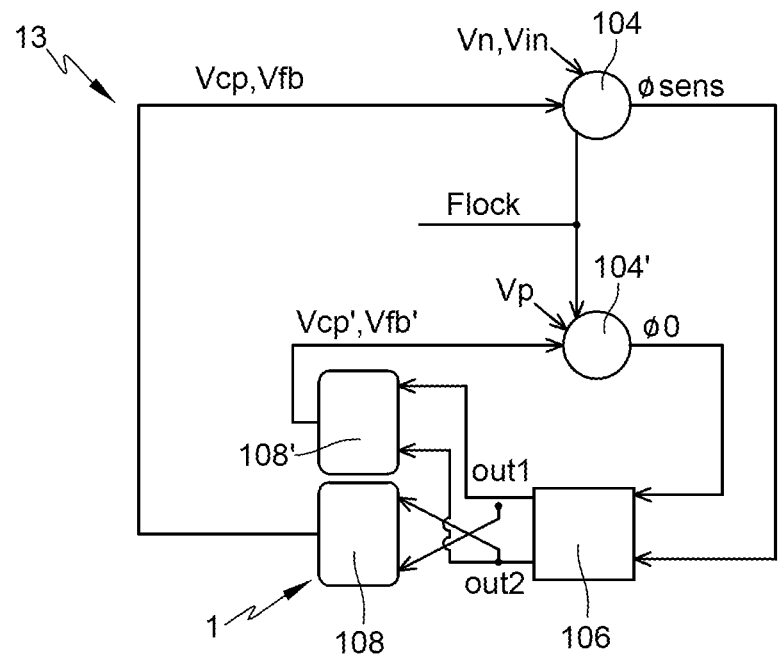
FIG. 13 illustrates an embodiment of a band-pass filter analog-to-time converter comprising the converter described with reference to FIGS. 1 to 12.

FIG. 13 illustrates an embodiment of a band-pass filter analog-to-time converter 13 comprising the converter 1, in the case where the voltage Vin is the first component Vn of a voltage Vindiff.

More particularly, in such embodiment, the converter 13 comprises, in addition to the converter 1, i.e. in addition to the oscillator 104, the circuit 106 and the circuit 108, the oscillator 104' and the circuit 108'.

The circuit 108' is configured for integrating the pulse signal out, i.e. the signals out1 and out2 in the example shown in FIG. 13. For example, the circuit 108' is configured for integrating the signals out1 and out2 in a complementary way to the integration of said signals, performed by the circuit 108. For example, the above amounts to the switch IT1 of the circuit 108' being controlled by whichever of the signals out1 and out2 controls the switch IT2 of the circuit 108, and to the switch IT2 of the circuit 108' being controlled by whichever of the signals out1 and out2 controls the switch IT1 of the circuit 108. The circuit 108' then supplies an output signal Vcp', which determines a feedback signal Vfb', the signal Vfb' being for example equal to the signal Vcp' in the example shown in FIG. 13.

The oscillator 104' is configured for supplying the signal Φ0, so that the phase shift between the signal Φ0 and the signal Flock is determined by a voltage difference between the voltage Vp and the voltage Vfb'.

The output signal out of the circuit 106, i.e. the signals out1 and out2 in the example shown in FIG. 13, are then representative not only of the analog-to-time conversion of the voltage Vin, but also more broadly of the analog-to-digital conversion of the voltage Vindiff.

A person skilled in the art is able to adapt the various variant embodiments described in relation to FIGS. 1 to 12 to the converter 13 shown in FIG. 13.

Figure 14:
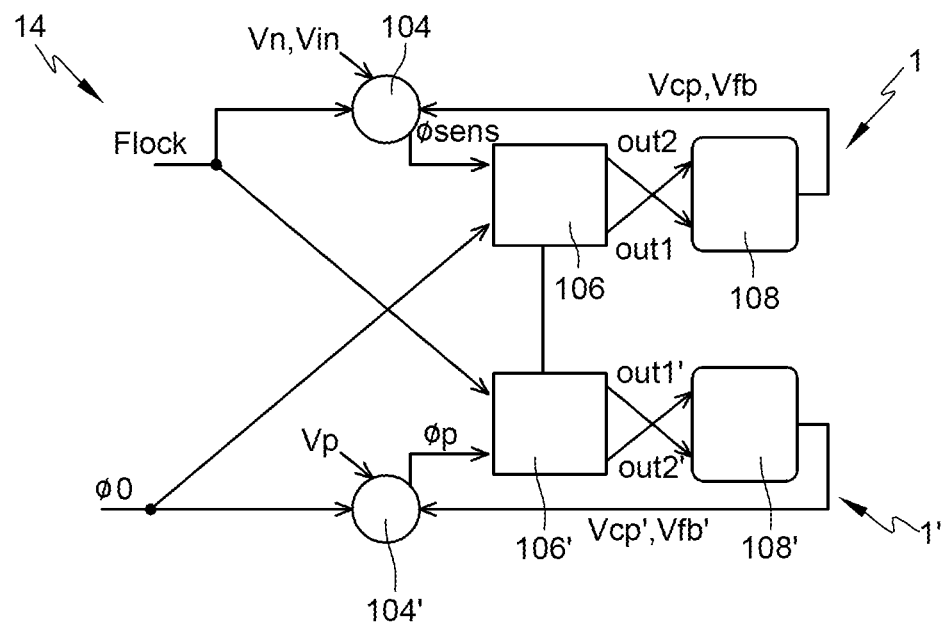
FIG. 14 illustrates another embodiment of a band-pass filter analog-to-time converter comprising the converter described with reference to FIGS. 1 to 12.

FIG. 14 illustrates another embodiment of a band-pass filter analog-to-time converter 14 comprising the converter 1, in the case where the voltage Vin is the first component Vn of a voltage Vindiff.

More particularly, in such embodiment, the converter 13 comprises, in addition to the converter 1 comprising the oscillator 104, the circuit 106 and the circuit 108, a converter 1' similar to the converter 1, the converter 1 comprising an oscillator 104' identical to the oscillator 104, a circuit 106' identical to circuit 106 and a circuit 108' identical to circuit 108.

In practice, the converter 1' uses the conversion of the voltage Vp, i.e. of the second component of the voltage Vindiff, into a time, in a way similar to the converter 1 which uses the conversion of the voltage Vin, i.e. the first component Vn of the voltage Vindiff, into time.

Thereby, in such embodiment, the circuit 106' is configured for receiving an output signal Φp from the oscillator 104 and the signal Flock, and for supplying at least one output pulse signal, for example two signals out1' and out2' in the example shown in FIG. 14, determined by a phase shift between the signal Flock and the signal Φp.

The circuit 108' is configured for integrating the output signal or signals of the circuit 106', for example the signals out1' and out2' in the example shown in FIG. 14, in a way similar to the way in which the circuit 108 integrates the output signal of the circuit 106.

The oscillator 104' is configured for receiving the signal Φ0. More particularly, the oscillator 104' receives the signal Φ0 where the oscillator 104 receives the signal Flock, which results in the oscillator 104' being locked on the signal Φ0 rather than on the signal Flock. The oscillator 104' is further configured so that the phase shift between the output signal Φp thereof and the signal Φ0 is determined by a voltage difference between the component Vp and a feedback voltage Vfb' determined by the output voltage Vcp' of the circuit 108', for example in a way similar to the way in which the oscillator 104 is configured so that the phase shift between the output signal thereof and the signal Flock is determined by the voltage difference DV between the voltage Vin (component Vn) and the voltage Vfb determined by the voltage Vcp.

Thus, the signals out1, out2, out1' and out2' are representative of the conversion of the voltage Vindiff into time by the converter 14.

As an example, in the converter 14, the signals Flock and Φ0 are supplied by two oscillators 300 and 302 looped back on one another by means of an inverter 304, as has been described in relation with FIG. 3.

A person skilled in the art is able to adapt the variants of embodiment described hereinabove for the converter 1, to the converter 14 shown in FIG. 14.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove, in particular relating to the direction of variation of the signals Vcp, Vfb, depending on the way in which the controls of the oscillator 104 are used on the basis of said signals and of the way in which the phase shift between Φsens and Flock varies with the signal Vin and the signals Vin, Vcp and Vfb. In other words, the person skilled in the art is able to adapt the connection between the circuits forming the converter 1 depending on the sign of the gain caused by each of the circuits so that the loopback of the return path 102 to the direct path 100 implements a negative feedback. For example, in some embodiments, the voltage Vcp decreases when the signal Φ0 advances in phase ahead of Φsens and increases when the signal Φ0 lags in phase behind Φsens.

What is claimed is:

1. A converter for converting a voltage into time, the converter comprising:

a direct path comprising a first injection-locked oscillator and a first circuit, the first circuit being configured for receiving an output signal of the first oscillator and a reference signal, and for providing at least a first pulse signal determined by a phase shift between the output signal of the first oscillator and the reference signal; and a feedback loop comprising a second circuit configured for integrating said at least one first pulse signal, wherein the first oscillator is configured for being controlled by a difference between the voltage to be converted and an output voltage of the feedback loop, the output voltage of the feedback loop being determined by an output voltage of the second circuit representative of the integration of said at least one first pulse signal, the feedback loop and the direct path being configured so that a loopback of the feedback loop on the direct path implements a negative feedback.

2. The converter according to claim 1, wherein the first oscillator is a voltage-controlled phase shifter.

3. The converter according to claim 1, wherein said at least one first pulse signal comprises pulses each having a time determined by the phase shift between the output signal of the first oscillator and the reference signal.

4. The converter according to claim 1, wherein:
the first oscillator is configured for receiving a periodic signal at a locking frequency of the first oscillator, and for said voltage difference to determine a phase shift between the output signal of the first oscillator and the periodic signal.

5. The converter according to claim 4, wherein the reference signal and the first circuit are configured for compensating for a fixed phase shift caused by the first oscillator between the periodic signal at the locking frequency and the output signal of the first oscillator.

6. The converter according to claim 4, wherein the converter comprises a second injection-locked oscillator configured for receiving the periodic signal and for providing the reference signal.

7. The converter according to claim 4, wherein the converter comprises two identical second injection-locked oscillators looped back on one another and configured for providing the periodic signal and the reference signal.

8. The converter according to claim 4, wherein:
the voltage to be converted is a first component of a differential signal comprising a second component;
the converter further comprises a third circuit identical to the second circuit, configured for integrating the at least one first pulse signal, preferentially in a complementary way with respect to the second circuit; and
the converter comprises a second injection-locked oscillator identical to the first oscillator, the second oscillator being configured for providing the reference signal and such that a voltage difference between the second component and a voltage determined by an output voltage of the third circuit determines a phase shift between the reference signal and the first periodic signal.

9. The converter according to claim 4, wherein:
the voltage to be converted is a first component of a differential signal comprising a second component;
the converter comprises a second injection-locked oscillator and a third circuit, the third circuit being configured for receiving an output signal from the second oscillator and the periodic signal, and for providing at least one second pulse signal determined by a phase shift between the output signal of the second oscillator and the periodic signal;
the converter comprises a fourth circuit configured for integrating said at least one second pulse signal; and
the second oscillator is configured for receiving the reference signal and such that a phase shift between its output signal and the reference signal is determined by a voltage difference between the second component and a voltage determined by an output voltage of the fourth circuit.

10. The converter according to claim 9, wherein the converter comprises two identical third injection-locked oscillators looped back on one another and configured for providing the periodic signal and the reference signal with a phase shift of Π/2 with respect to the periodic signal.

11. The converter according to claim 9, wherein:
the first and second oscillators are identical;
the first and third circuits are identical; and
the second and fourth circuits are identical.

12. The converter according to claim 4, wherein the converter is configured so that the locking frequency is in the middle of a locking range of the first oscillator.

13. The converter according to claim 1, wherein:
said at least one first pulse signal (out) comprises two first pulse signals;
the first circuit comprises a phase detector configured for providing the two first pulse signals.

14. The converter according to claim 1, wherein the second circuit is a charge pump.

15. The converter according to claim 1, wherein each oscillator is a relaxation oscillator comprising an S-R flip-flop configured for controlling charging and discharging phases in two capacitors (CL), and for being controlled on the basis of the voltages across said two capacitors.

* * * * *